United States Patent
Kim

(10) Patent No.: US 11,778,833 B2
(45) Date of Patent: Oct. 3, 2023

(54) NONVOLATILE MEMORY DEVICE

(71) Applicant: SK hynix Inc., Gyeonggi-do (KR)

(72) Inventor: Bo Yun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/532,862

(22) Filed: Nov. 22, 2021

(65) Prior Publication Data

US 2022/0085040 A1   Mar. 17, 2022

Related U.S. Application Data

(62) Division of application No. 16/675,006, filed on Nov. 5, 2019, now Pat. No. 11,217,598.

(30) Foreign Application Priority Data

May 23, 2019 (KR) .......................... 10-2019-0060870

(51) Int. Cl.
*H10B 43/35* (2023.01)
*H10N 70/00* (2023.01)

(52) U.S. Cl.
CPC ........... *H10B 43/35* (2023.02); *H10N 70/884* (2023.02); *H10N 70/8828* (2023.02); *H10N 70/8836* (2023.02)

(58) Field of Classification Search
CPC .......... H01L 27/1057; H01L 27/11206; H01L 27/1122; H01L 27/11226; H01L 27/11233; H01L 27/11246; H01L 27/1126; H01L 27/11266; H01L 45/04; H01L 45/10; H01L 45/1206; H01L 45/122; H01L 45/1226; H01L 45/1233; H01L 45/1253; H01L 45/141; H01L 45/144; H01L 45/145; H01L 45/146; H01L 45/147; H01L 45/148; H01L 27/1157; H01L 27/11582; H01L 27/11563; H01L 27/11568; H01L 27/2463;
(Continued)

(56) References Cited

U.S. PATENT DOCUMENTS 9,093,369 B2 * 7/2015 Shin .................... H01L 27/2436
9,230,974 B1   1/2016 Pachamuthu et al.
(Continued)

OTHER PUBLICATIONS

Office Action issued by CNIPA for Chinese Patent Application No. 201911187722.1 dated Apr. 28, 2023.

*Primary Examiner* — Natalia A Gondarenko
(74) *Attorney, Agent, or Firm* — IP & T GROUP LLP

(57) ABSTRACT

A nonvolatile memory device according to an embodiment of the present disclosure includes a substrate having a channel layer, a first tunneling layer disposed on the channel layer, a second tunneling layer disposed on the first tunneling layer, a third tunneling layer disposed on the second tunneling layer, a charge trap layer disposed on the third tunneling layer, a charge barrier layer disposed on the charge trap layer, and a gate electrode layer disposed on the charge barrier layer. The first tunneling layer includes a first insulative material. The second tunneling layer includes a second insulative material. The third tunneling layer includes a second insulative material. The resistance switching material is a material whose electric resistance varies reversibly between a high resistance state and a low resistance state depending on a magnitude of an applied electric field.

19 Claims, 20 Drawing Sheets

(58) Field of Classification Search
CPC ....... H01L 27/2436; H01L 2027/11838; H01L 29/4011; H01L 29/40117; H01L 29/42312; H01L 29/42316; H01L 29/4232; H01L 29/4234; H01L 29/42344; H01L 29/42372; H01L 29/435; H01L 29/4236; H01L 29/66613; H01L 29/66833; H01L 29/66492; H01L 29/66863; H01L 29/7836; H01L 29/7882; H01L 29/7883; H01L 29/792; H01L 29/7923; H01L 45/1608; H01L 45/1641; H01L 45/165; H01L 45/1666; H10B 43/27; H10B 43/30; H10B 43/35; H10B 63/30; H10B 63/34; H10B 20/30; H10B 20/40; H10B 41/30; H10B 41/35; H10B 41/48; H10N 70/8828; H10N 70/8836; H10N 70/821; H10N 70/826; H10N 70/828; H10N 70/881; H10N 70/883; H10N 70/884

USPC ................................. 257/314, 316, 321, 411
See application file for complete search history.

(56) References Cited

U.S. PATENT DOCUMENTS

| | | | |
|---|---|---|---|
| 10,803,941 B2* | 10/2020 | Mazed | ............... H01L 27/2436 |
| 2006/0198190 A1 | 9/2006 | Lue | |
| 2009/0321811 A1* | 12/2009 | Lee | ...................... H01L 29/513 |
| | | | 257/E27.013 |
| 2014/0035026 A1* | 2/2014 | Jang | ................. H01L 27/11582 |
| | | | 257/324 |
| 2016/0005882 A1* | 1/2016 | Kwon | .................. H01L 45/085 |
| | | | 257/314 |
| 2016/0163981 A1 | 6/2016 | Toriyama et al. | |

* cited by examiner

NONVOLATILE MEMORY DEVICE

CROSS-REFERENCE TO RELATED APPLICATION

This application is a division of U.S. patent application Ser. No. 16/675,006 filed on Nov. 5, 2019, which claims benefits of priority of Korean Patent Application No. 10-2019-0060870 filed on May 23, 2019. The disclosure of each of the foregoing application is incorporated herein by reference in its entirety.

BACKGROUND

1. Technical Field

Various embodiments of the present disclosure generally relate to a semiconductor device and, more particularly, to a nonvolatile memory device having a tunneling structure.

2. Related Art

As demand for enhanced integration and more versatile electronic devices has increased, research for memory device structures that can improve the structural stability and reliability of data storage and operation has continued unabated.

Currently, a transistor-type nonvolatile memory device employing a three-layered structure of a charge tunneling layer, a charge trap layer and a charge barrier layer is used widely as a charge storage structure.

Typically, a nonvolatile memory device performs an operation of introducing electric charges from a substrate into the charge trap layer (programming operation) or erasing the electric charges of the charge trap layer (erasing operation), and the charge trap layer can perform a memory operation by storing the introduced electric charges in a nonvolatile manner. Also, a nonvolatile memory device can be implemented in a NAND-type structure in which pluralities of cell transistors are connected to each other to have a string shape.

SUMMARY

Various embodiments of the present invention are directed to a nonvolatile memory device having an improved tunneling structure. The nonvolatile memory device may exhibit improved program and erase operation efficiency. The nonvolatile memory device may also exhibit an improved retention characteristic.

The nonvolatile memory device according to an embodiment of the present disclosure includes a substrate having a channel layer, a first tunneling layer disposed on the channel layer, a second tunneling layer disposed on the first tunneling layer, a third tunneling layer disposed on the second tunneling layer, a charge trap layer disposed on the third tunneling layer, a charge barrier layer disposed on the charge trap layer, and a gate electrode layer disposed on the charge barrier layer. The first tunneling layer includes a first insulative material. The second tunneling layer includes a second insulative material. The third tunneling layer includes a second insulative material. The resistance switching material is a material whose electric resistance varies reversibly between a high resistance state and a low resistance state depending on a magnitude of an applied electric field.

The nonvolatile memory device according to another embodiment of the present disclosure includes a substrate, an electrode stack structure disposed on the substrate, the electrode stack structure including gate electrode layers and interlayer insulation layers, which are alternately stacked in a direction perpendicular to the substrate, a first trench penetrating the electrode stack structure on the substrate to expose sidewall surfaces of the gate electrode layers and the interlayer insulation layers, a charge barrier layer disposed to cover the interlayer insulation layers and the gate electrode layers along an inner surface of the trench, a charge trap layer disposed on the charge barrier layer along the inner surface of the trench, a tunneling structure disposed on the charge trap layer along the inner surface of the trench, and a channel layer disposed to contact the tunneling structure. The tunneling structure includes a first tunneling layer including a first insulative material, a second tunneling layer including a resistance switching material, and a third tunneling layer including a second insulative material.

These and other features and advantages of the present invention will become apparent to those skilled in the art of the invention from the following detailed description in conjunction with the following drawings.

DETAILED DESCRIPTION

Figure 1:
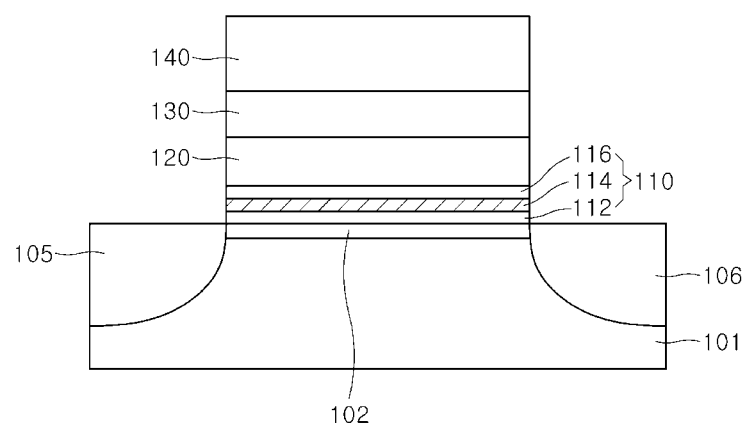
FIG. 1 is a cross-sectional view schematically illustrating a nonvolatile memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located, formed or disposed on another element, it may be understood that the element is directly located, formed or disposed on the other element, or an additional element may be interposed between the element and the other element. The same reference numerals refer to the same elements throughout the specification.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

FIG. 1 is a cross-sectional view schematically illustrating a nonvolatile memory device 1 according to an embodiment of the present disclosure. FIG. 2 is a graph illustrating an electric characteristic of a tunneling device having a resistance switching material according to an embodiment of the present disclosure.

Referring to FIG. 1, the nonvolatile memory device 1 may include a substrate 101, a tunneling structure 110, a charge trap layer 120, a charge barrier layer 130 and a gate electrode layer 140. In addition, the substrate 101 may include a channel layer 102 under the tunneling structure 110. The substrate 101 may also include a source region 105 and a drain region 106 disposed in regions of the substrate 101 that are located at opposite ends of the channel layer 102. The source region 105 and the drain region 106 may not overlap with the channel region 102 in a direction Z which is the direction of the stacking of the tunneling structure 110, the charge trap layer 120, the charge barrier layer 130, and the gate electrode 140. In an embodiment, the nonvolatile memory device 1 may be a field effect transistor-type flash memory device.

The substrate 101 may, for example, include a semiconductor material. The substrate 101 may, for example, be a silicon (Si) substrate, a gallium arsenic (GaAs) substrate, an indium phosphide (InP) substrate, a germanium (Ge) substrate or a silicon germanium (SiGe) substrate. In an embodiment, the semiconductor substrate may be doped to have a predetermined conductivity. As an example, the substrate 101 may be doped with an n-type dopant or a p-type dopant. As another example, the substrate 101 may include a well region doped with an n-type dopant or a p-type dopant in the substrate 101.

The source region 105 and the drain region 106 may each be a region of the substrate 101, which is doped into n-type or p-type. When the substrate 101 is doped into n-type or p-type, the source region 105 and the drain region 106 may be regions doped with a dopant of an opposite doping type to the doping type of the substrate 101. The channel layer 102 may be a region conducted by a carrier having a charge when a voltage is applied between the source region 105 and the drain region 106. As an example, the channel layer 102 may be a region of the substrate 101, which has a high mobility of electrons or holes between the source region 105 and the drain region 106.

The tunneling structure 110 may be disposed on the substrate 101. The tunneling structure 110 may include a first tunneling layer 112, a second tunneling layer 114 and a third tunneling layer 116 that are sequentially disposed on the channel layer 102. The first tunneling layer 112 may be disposed on the channel layer 102. According to the embodiment of FIG. 1, the first tunneling layer 112 may be directly disposed on the channel layer 102. The first tunneling layer 112 may include a first insulative material. For example, the first tunneling layer 112 may be formed of a first insulative material. Examples of suitable first insulative materials may include silicon oxide, silicon oxynitride, silicon nitride, or a combination of two or more thereof. In a specific embodiment, the first tunneling layer 112 may be a silicon oxide layer.

The second tunneling layer 114 may be disposed on the first tunneling layer 112. According to the embodiment of FIG. 1, the second tunneling layer 114 may be disposed directly on the first tunneling layer 112. The second tunneling layer 114 may include a resistance switching material. For example, the second tunneling layer 114 may be formed of a resistance switching material. The resistance switching material may be a material whose electric resistance changes reversibly between a high resistance state and a low resistance state depending on the magnitude of an applied electric field. Examples of suitable resistance switching materials may include an indium-antimony-tellurium-based alloy, a germanium-antimony-tellurium-based alloy, an arsenic-antimony-tellurium-based alloy, a tin-antimony-tellurium-based alloy, or a combination of two or more thereof. Other examples of suitable resistance switching materials may include niobium oxide, vanadium oxide, copper-doped silicon oxide, silver-doped titanium oxide, or a combination of two or more thereof. In an embodiment, niobium oxide may be used which may not satisfy the stoichiometry, e.g., the niobium oxide may include an oxygen vacancy.

The third tunneling layer 116 may be disposed on the second tunneling layer 114. The third tunneling layer 116 may be disposed directly on the second tunneling layer 114 as shown in FIG. 1. The third tunneling layer 116 may include a second insulative material. For example, the third tunneling layer 116 may be formed of a second insulative material. Examples of suitable second insulative materials may include silicon oxide, silicon oxynitride, silicon nitride, or a combination of two or more thereof. In an embodiment, the third tunneling layer 116 may be a silicon oxide layer. The third tunneling layer 116 may be formed of the same material or different material as the first tunneling layer 112.

The charge trap layer 120 and the charge barrier layer 130 may be sequentially disposed on the tunneling structure 110. The charge trap layer 120 may be disposed directly on the tunneling structure 110 as shown in FIG. 1. The charge trap layer 120 may trap electrons introduced from the channel layer 102 in trap sites of the charge trap layer 120 and store the trapped electrons in a nonvolatile manner during a program operation. In addition, the charge trap layer 120 may erase the stored trapped electrons by recombining holes introduced from the channel layer 102 with the electrons stored in the charge trap layer 120 during an erasing operation. The charge trap layer 120 may have a band gap energy lower than a band gap energy of the charge barrier layer 130 and a band gap energy of the third tunneling layer 116. In an embodiment, the charge trap layer 120 may include nitride or oxynitride. As an example, the charge trap layer 120 may be a silicon nitride layer or a silicon oxynitride layer.

The charge barrier layer 130 may suppress the electrons or holes that are introduced from the channel layer 102 into the charge trap layer 120 from moving to the gate electrode layer 140. The charge barrier layer 130 may, for example, include silicon oxide, silicon nitride, silicon oxynitride, or a combination of two or more thereof. As an example, the charge barrier layer 130 may be a silicon oxide layer.

The gate electrode layer 140 may include a conductive material. For example, the gate electrode layer 140 may be formed of a conductive material. Suitable conductive materials may, for example, include tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

As described above, the nonvolatile memory device 1 according to an embodiment of the present disclosure may include a tunneling structure having first, second and third tunneling layers with the second tunneling layer disposed between the first and third tunneling layers wherein the second tunneling layer includes a resistance switching material.

The electrical characteristics of a tunnel device 2A employing a thin film having a resistance switching material 114' as a tunneling layer will be described below with reference to FIGS. 2A and 2B.

Specifically, the tunnel device 2A is provided including a tunneling layer 114' having niobium oxide including oxygen vacancies as a resistance switching material. The tunneling layer 114' is disposed between a first platinum electrode layer 10 and a second platinum electrode layer 20. Then, a voltage is applied between the first and second platinum electrode layers 10, 20 to evaluate a current characteristic of the tunnel device 2A.

Figure 2A:
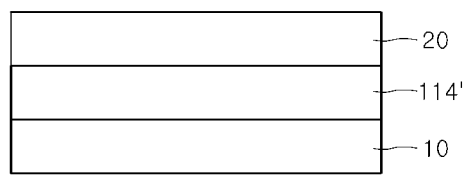
FIG. 2A is cross-sectional view schematically illustrating a tunnel device having a resistance switching material according to an embodiment of the present disclosure.
Figure 2B:
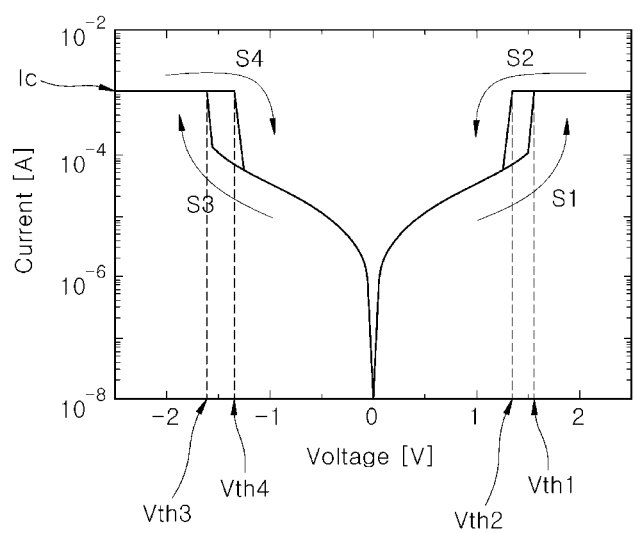
FIG. 2B is a graph illustrating an electric characteristic of the tunneling device of FIG. 2A.

Referring to FIGS. 2A and 2B, the second platinum electrode layer 20 may be grounded and a bias voltage having a positive polarity may be applied to the first platinum electrode layer 10 while sequentially increasing from 0V. An output current increases relatively slowly as the voltage increases until the applied voltage reaches a first threshold voltage Vth1, and after the applied voltage reaches the first threshold voltage Vth1, the output current increases relatively abruptly with the increasing voltage. That is, at or above the first threshold voltage Vth1, the resistance state of the niobium oxide layer 114' is converted from a high resistance state to a low resistance state. In FIG. 2B, the relatively abruptly increasing output current is limited to an upper limit current Ic to prevent a measuring circuit from being damaged. Such a voltage-current characteristic may appear along a first behavior curve S1.

Meanwhile, when the applied voltage is reduced again after ensuring the output current is equal to or greater than the upper limit current Ic, the output current can be relatively abruptly reduced when the applied voltage reaches the second threshold voltage Vth2. Thereafter, as the applied voltage decreases, the output current may decrease relatively slowly. In other words, at or below the second threshold voltage Vth2, the resistance state of the niobium oxide layer is converted from the low resistance state to the high resistance state. The voltage-current characteristic may appear along a second behavior curve S2.

Next, the second platinum electrode layer 20 may be grounded, and a bias voltage having a negative polarity may be applied to the first platinum electrode layer 10 while sequentially increasing from 0V in a negative direction. The output current increases relatively slowly as the voltage increases until the applied voltage reaches a third threshold voltage Vth3, and after the applied voltage reaches the third threshold voltage Vth3, the output current increases relatively abruptly with the increasing voltage. In other words, at or above the third threshold voltage Vth3, the resistance state of the niobium oxide layer is converted from the high resistance state to the low resistance state. In FIG. 2B, similarly, the relatively abruptly increasing output current is limited to the upper limit current Ic to prevent the measurement circuit from being damaged. Such a voltage-current characteristic may appear along a third behavior curve S3.

Meanwhile, when the applied voltage is reduced again after ensuring the output current is equal to or greater than the upper limit current Ic, the output current may be relatively abruptly reduced when the applied voltage reaches a fourth threshold voltage Vth4. Thereafter, as the applied voltage decreases, the output current may decrease relatively slowly. In other words, at or below the fourth threshold voltage Vth4, the resistance state of the niobium oxide layer may be converted from the low resistance state to the high resistance state. The voltage-current characteristic may appear along a fourth behavior curve S4.

The voltage-current characteristics of the tunneling layer including the resistance switching material in the tunneling device described above can be substantially the same even when a voltage is applied across the second tunneling layer 114 of the nonvolatile memory device 1 of this embodiment. The second tunneling layer 114 of the nonvolatile memory device 1 may have a current characteristic in which the current increases nonlinearly and rapidly in response to a voltage when the voltage which is equal to or greater than a predetermined first threshold voltage, is applied to the second tunneling layer 114. Also, the second tunneling layer 114 exhibiting the nonlinearly and rapidly increasing current characteristic may have a current characteristic in which the current decreases nonlinearly and rapidly in response to the voltage when the applied voltage is reduced again to a predetermined second threshold voltage or lower.

When the second tunneling layer 114 having the above-described resistance switching material is applied to the tunneling structure 110 of FIG. 1, the nonvolatile memory device 1 may exhibit a charge tunneling phenomenon associated with those shown in FIGS. 3A to 3C described below.

Figure 3A:
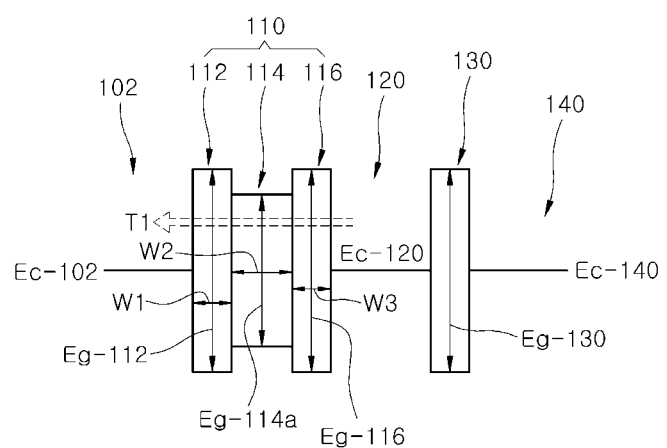
FIGS. 3A to 3C are views schematically illustrating an energy diagram depending on operations of a nonvolatile memory device according to an embodiment of the present disclosure.
Figure 3B:
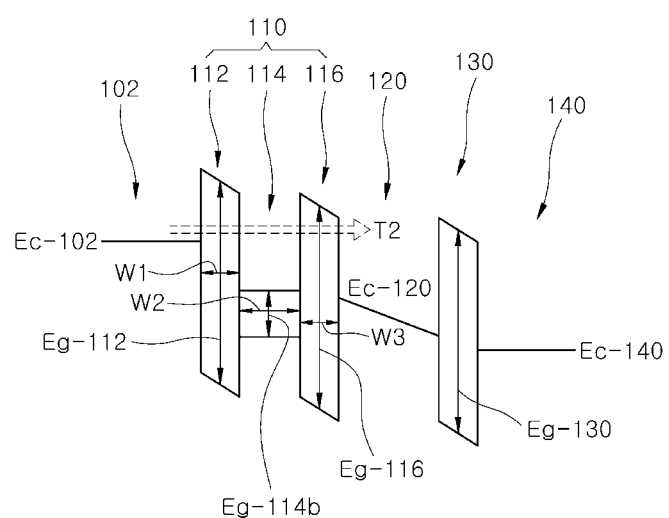
Figure 3C:
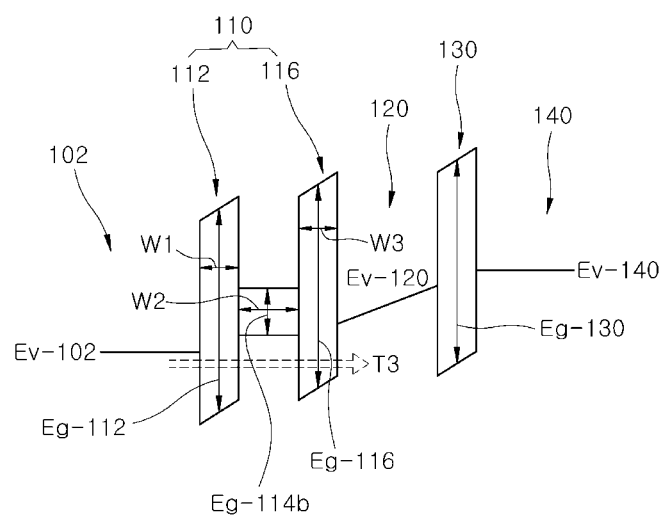

FIGS. 3A to 3C are views schematically illustrating energy diagrams depending on operations of a nonvolatile memory device according to an embodiment of the present disclosure. The operations of the nonvolatile memory device may be described using the nonvolatile memory device 1 described above with reference to FIG. 1. Specifically, FIG. 3A is an energy band diagram when the nonvolatile memory device 1 is in a standby state. FIG. 3B is an energy band diagram when the nonvolatile memory device 1 performs a program operation. FIG. 3C is an energy band diagram when the nonvolatile memory device 1 performs an erase operation.

Referring to FIGS. 3A to 3C, a band gap energy Eg-112 of the first tunneling layer 112, band gap energies Eg-114a and Eg-114b of the second tunneling layer 114, a band gap energy Eg-116 of the third tunneling layer 116, and a band gap energy Eg-130 of the charge barrier layer 130 are illustrated. In addition, a conduction band energy Ec-102 and a valence band energy Ev-102 of the channel layer 102, a conduction band energy Ec-120 and a valence band energy Ev-120 of the charge trap layer 120, and a conduction band energy Ec-140 and a valence band energy Ev-140 of the gate electrode layer 140 are illustrated.

Referring to FIG. 3A, when the nonvolatile memory device 1 is in the standby state, that is, when the nonvolatile memory device 1 does not perform any operation such as a program operation or an erase operation, the second tunneling layer 114 may have a first band gap energy Eg-114a. In other words, the second tunneling layer 114 may maintain a high resistance state. In this state, the second tunneling layer 114 can suppress together with the first and third tunneling layers 112 and 116, a phenomenon T1 in which electrons trapped in the charge trap layer 120 tunnel to the channel layer 102. That is, in FIG. 3A, the tunneling T1 of electrons of the charge trap layer 120 to the channel layer 102 by tunneling through the first to third tunneling layers 112, 114 and 116 may be suppressed. The first to third tunneling layers 112, 114 and 116 may have widths W1, W2 and W3 of first to third tunneling barriers, respectively. The width W2 of the second tunneling layer may be larger than the widths W1 and W3 of the first and third tunneling layers 112, 116, respectively. The widths W1 and W3 may be the same. All of the first to third tunneling layers 112, 114 and 116 may function as barriers against the electron tunneling, so that the retention of the electrons stored in the charge trap layer 120 can be improved.

Referring to FIG. 3B, the nonvolatile memory device 1 may perform a program operation from the standby state. The program operation may refer to an operation T2 of tunneling electrons of the channel layer 102 to the charge trap layer 120. During the program operation, a program voltage applied between the gate electrode layer 140 and the channel layer 102 can convert the resistance state of the second tunneling layer 114 from a high resistance state to a low resistance state. The program voltage may be equal to or greater than a threshold voltage that changes the electric resistance of the resistance switching material in the second tunneling layer 114 from the high resistance state to the low resistance state. Therefore, during the period of time for which the program voltage is applied between the gate electrode layer 140 and the channel layer 102, the second tunneling layer 114 may have the second band gap energy Eg-114b that is less than the first band gap energy Eg-114a.

When the second tunneling layer 114 has the second band gap energy Eg-114b, electrons can move to the charge trap layer 120 after tunneling only through the first and third tunneling layers 112 and 116 with the first and third tunneling width W1 and W3 from the channel layer 102. Since the second tunneling layer 114 does not function as a tunneling barrier by changing the band gap energy from the first band gap energy Eg-114a to the second band gap energy Eg-114b, the electron tunneling efficiency from the channel layer 102 to the charge trap layer 120 can be improved.

Meanwhile, after the program operation illustrated in FIG. 3B is completed, the band gap energy state of the nonvolatile memory device 1 may be converted back to the standby state of FIG. 3A. At this time, as the externally applied voltage is removed, the band gap energy of the second tunneling layer 114 may increase again from the second band gap energy Eg-114b to the first band gap energy Eg-114b. Accordingly, as described above, the second tunneling layer 114 can function as a tunneling barrier layer based on the increased band gap energy together with the first and third tunneling layers 112 and 116, in the standby state.

Referring to FIG. 3C, the nonvolatile memory device 1 may perform an erase operation from the standby state. The erase operation can refer to an operation T3 of tunneling holes of the channel layer 102 to the charge trap layer 120. The holes tunneled to the charge trap layer 120 may be recombined with the electrons stored in the charge trap layer 120, so that the electric signal stored in the charge trap layer 120 can be erased.

During the erase operation, the erase voltage applied between the gate electrode layer 140 and the channel layer 102 can convert the resistance state of the second tunneling layer 114 from the high resistance state into the low resistance state. The erase voltage may be equal to or greater than a threshold voltage that changes the electric resistance of the resistance switching material of the second tunneling layer 114 from the high resistance state to the low resistance state. Accordingly, during the application of the erase voltage between the gate electrode layer 140 and the channel layer 102, the second tunneling layer 114 may have a second band gap energy Eg-114b lower than the first band gap energy Eg-114a.

When the second tunneling layer 114 has the second band gap energy Eg-114b, the holes can move to the charge trap layer 120 after tunneling only through the first and third tunneling layers 112 and 116 having the first and third tunneling widths W1 and W3. Since the second tunneling layer 114 does not function as a tunneling barrier by changing the band gap energy from the first band gap energy Eg-114a to the second band gap energy Eg-114b, the hole tunneling efficiency from the channel layer 102 to the charge trap layer 120 can be improved. Meanwhile, the holes which are tunneled to the charge trap layer 120 may be recombined with the electrons in the charge trap layer 120, so that the erase operation can be performed.

After the erase operation illustrated in FIG. 3C is completed, the band gap energy state of the nonvolatile memory device 1 can be converted back into the standby state of FIG. 3A. At this time, as the externally applied voltage is removed, the band gap energy of the second tunneling layer 114 can increase again from the second band gap energy Eg-114b to the first band gap energy Eg-114a. Accordingly, as described above, the second tunneling layer 114 may function as a tunneling barrier layer together with the first and third tunneling layers 112 and 116 in the standby state.

According to an embodiment of the present disclosure, the nonvolatile memory device may include a tunneling structure having first to third tunneling layers. The second tunneling layer disposed between the first and third tunneling layers may include a resistance switching material. The second tunneling layer may perform a function as a barrier against charge tunneling at a voltage lower than a predetermined threshold voltage, so that the retention of charges stored in a charge trap layer can be improved. In addition, the second tunneling layer may not function as a barrier layer for charge tunneling at an applied voltage equal to or above a predetermined threshold voltage, so that the charge tunneling from the substrate to the charge trap layer can be increased. As a result, the program and erase efficiencies of the nonvolatile memory device can be improved.

Figure 4:
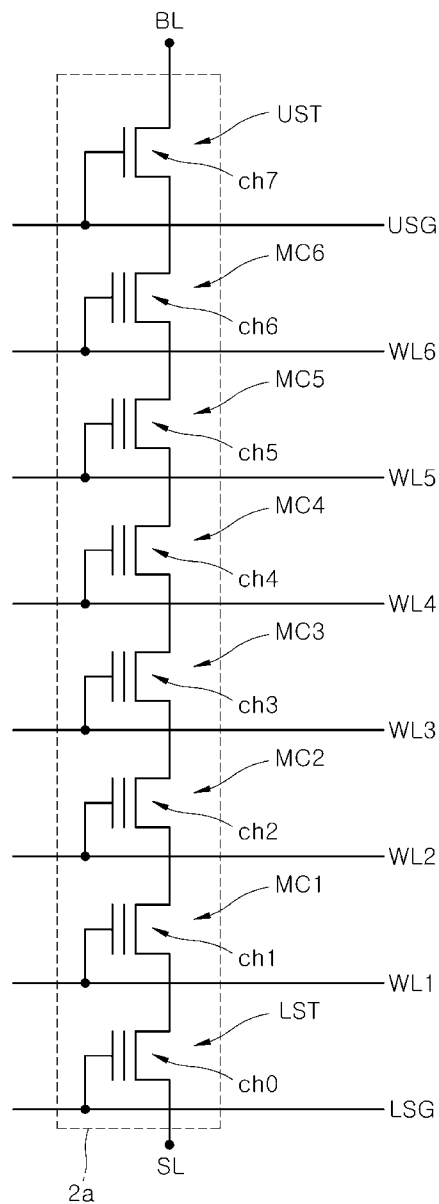
FIG. 4 is a circuit diagram schematically illustrating a nonvolatile memory device according to another embodiment of the present disclosure.

FIG. 4 is a circuit diagram schematically illustrating a nonvolatile memory device 2 according to another embodiment of the present disclosure. Referring to FIG. 4, the nonvolatile memory device 2 may include a string 2a having a plurality of cell arrays in which channels are connected in series. One end of the string 2a may be connected to a source line SL and the other end of the string 2a may be connected to a bit line BL. The string 2a may include first to sixth memory cell transistors MC1, MC2, MC3, MC4, MC5 and MC6, which are connected to each other in series. Also, the string 2a may include a lower selection transistor LST disposed between the first memory cell transistor MC1 and the source line SL, and an upper selection transistor UST disposed between the sixth memory cell transistor MC6 and the bit line BL. Although the string 2a is illustrated as having six memory cell transistors in FIG. 4 for the convenience of description, it is not necessarily limited thereto and the number of the memory cell transistors constituting the string 2a is not limited. In addition, although the string 2a is illustrated as having one lower selection transistor LST and one upper selection transistor UST in FIG. 4, it is not necessarily limited thereto. As the lower selection transistor LST, a plurality of lower selection transistors whose channels are connected to each other in series may be arranged. Similarly, as the upper selection transistor UST, a plurality of upper selection transistors whose channels are connected to each other in series may be arranged. The nonvolatile memory device 2 may, for example, be a NAND type flash device.

The first to sixth memory cell transistors MC1, MC2, MC3, MC4, MC5 and MC6 may have first to sixth channel layers ch1, ch2, ch3, ch4, ch5 and ch6, respectively, between the source line SL and the bit line BL. The first to sixth memory cell transistors MC1, MC2, MC3, MC4, MC5 and MC6 may each have a charge trap layer adjacent to the first to sixth channel layers ch1, ch2, ch3, ch4, ch5 and ch6, respectively. The gate electrode layers of the first to sixth memory cell transistors MC1, MC2, MC3, MC4, MC5 and MC6 may be connected to different first to sixth word lines WL1, WL2, WL3, WL4, WL5 and WL6, respectively. The upper selection transistor UST and the lower selection transistor LST may be turned on or turned off, respectively, to thereby apply a voltage between the bit line BL and the source line SL to the first to sixth channel layers ch1, ch2, ch3, ch4, ch5 and ch6 or to remove the voltage from the first to sixth channel layers ch1, ch2, ch3, ch4, ch5 and ch6. The gate electrode layers of the upper selection transistor UST and the lower selection transistor LST may be connected to an upper selection line USL and a lower selection line LSL, respectively.

In an embodiment, when the upper selection transistor UST and the lower selection transistor LST are turned on, a predetermined gate voltage may be applied to corresponding memory cell transistors MC1, MC2, MC3, MC4, MC5 and MC6 through the corresponding first to sixth word lines WL1, WL2, WL3, WL4, WL5 and WL6, respectively. In the memory cell transistors MC1, MC2, MC3, MC4, MC5 and MC6 to which the gate voltage is applied, a program operation or an erase operation may occur between the charge trap layer and the channel layer. The program operation or the erase operation may proceed to an operation in which electrons are introduced into the charge trap layer or electrons stored in the charge trap layer are removed, by tunneling the electrons or holes in the channel layer to the charge trap layer. The change of the electrons following the program operation or erase operation may be stored in a nonvolatile manner in the charge trap layer as an electric signal. Accordingly, the first to sixth memory cell transistors MC1, MC2, MC3, MC4, MC5 and MC6 can perform a nonvolatile memory operation.

Figure 5A:
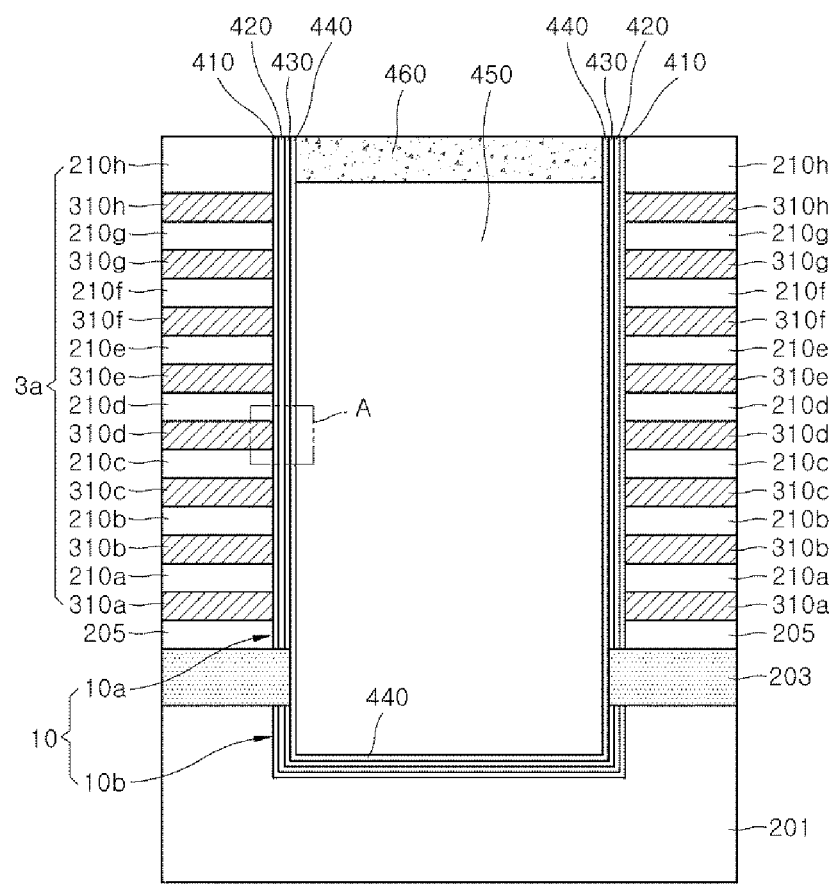
FIGS. 5A and 5B are cross-sectional views schematically illustrating a nonvolatile memory device according to an embodiment of the present disclosure.
Figure 5B:
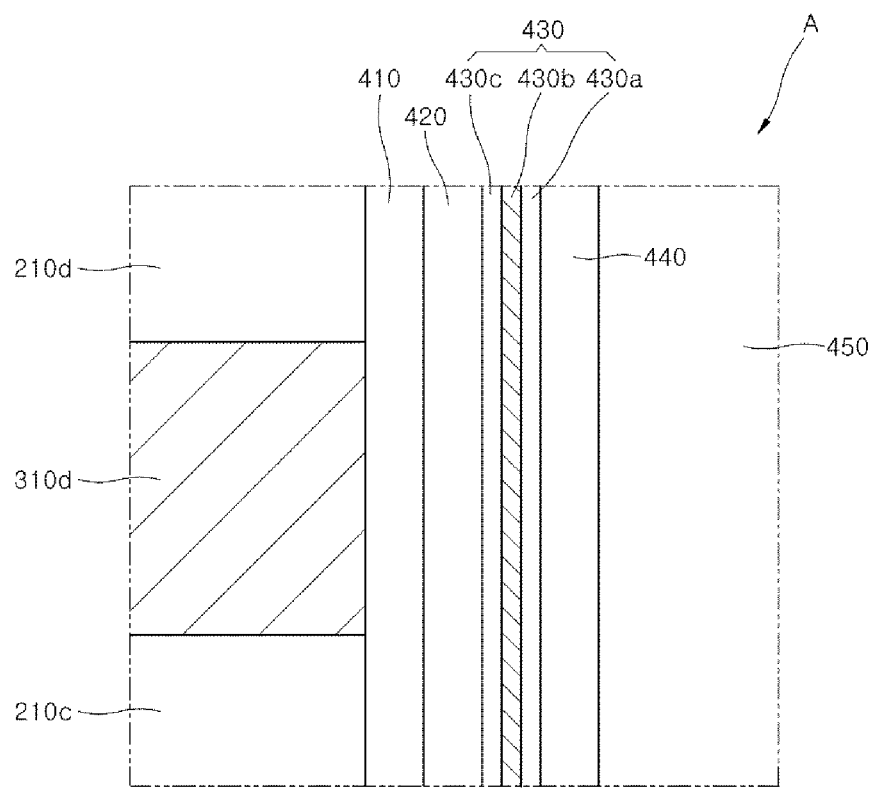

FIG. 5A is a cross-sectional view schematically illustrating a nonvolatile memory device 3 according to an embodiment of the present disclosure. FIG. 5B is an enlarged view of region 'A' illustrated in FIG. 5A. The nonvolatile memory device 3 of FIGS. 5A and 5B may be an implementation of the nonvolatile memory device 2 having the circuit diagram of FIG. 4.

Referring to FIGS. 5A and 5B, the nonvolatile memory device 3 may include a substrate 201 and an electrode stack structure 3a disposed on the substrate 201. The electrode stack structure 3a may be disposed directly on the substrate 201. In the illustrated embodiment of FIG. 5A, the electrode stack structure 3a is not disposed directly on the substrate 201 but a source contact layer is disposed between the substrate 201 and the electrode stack structure 3a. The electrode stack structure 3a may include a plurality of gate electrode layers, for example, first to eighth gate electrode layers 310a, 310b, 310c, 310d, 310e, 310f, 310g and 310h. The electrode stack structure 3a may also include a plurality of interlayer insulation layers, for example, first to eighth interlayer insulation layers 210a, 210b, 210c, 210d, 210e, 210f, 210g and 210h, which are alternately stacked with the plurality of the gate electrode layers. In an embodiment, the eighth interlayer insulation layer 210h may be formed to be thicker than any of the first to seventh interlayer insulation layers 210a, 210b, 210c, 210d, 210e, 210f and 210g. In an embodiment, the first to seventh interlayer insulation layers 210a, 210b, 210c, 210d, 210e, 210f and 210g may be formed to have substantially the same thickness. Similarly, the first to eighth gate electrode layers 310a, 310b, 310c, 310d, 310e, 310f, 310g and 310h may be formed to have substantially the same thickness.

In addition, the nonvolatile memory device may include a trench 10 having a first portion 10a and a second portion 10b. The first portion 10a of the trench 10 may be formed to penetrate the electrode stack structure 3a over the substrate 201, and the second portion 10b of the trench 10 may have a shape extending discontinuously to the lower portion of the first portion 10a and may be formed under the surface of the substrate 201.

The first portion 10a of the trench 10 may expose sidewall surfaces of the first to eighth gate electrode layers 310a, 310b, 310c, 310d, 310e, 310f, 310g and 310h and the first to eighth interlayer insulation layers 210a, 210b, 210c, 210d, 210e, 210f, 210g and 210h. In addition, the nonvolatile memory device 3 may have the source contact layer 203 between the substrate 201 and the electrode stack structure 3a. The source contact layer 203 may be formed at a level separating the first portion 10a and the second portion 10b of the trench 10 along a direction perpendicular to the substrate 201, that is, the z-direction. That is, sidewalls of trench 10 are divided into sidewalls of the first portion 10a and sidewalls of the second portion 10b by the source contact layer 203.

The nonvolatile memory device 3 may include a charge barrier layer 410 disposed along an inner surface of the trench 10. The charge barrier layer 410 may be disposed directly on the inner surface of the trench 10. The charge barrier layer 410 may be disposed to contact and cover the first to eighth gate electrode layers 310a, 310b, 310c, 310d, 310e, 310f, 310g and 310h and the first to eighth interlayer insulation layers 210a, 210b, 210c, 210d, 210e, 210f, 210g and 210h, along an inner surface of the first portion 10a of the trench 10. Also, the charge barrier layer 410 may be disposed to cover the substrate 201 along an inner surface of the second portion 10b of the trench 10. The charge barrier layer 410 may be disposed directly on the substrate 201 along an inner surface of the second portion 10b of the trench 10.

In addition, the nonvolatile memory device 3 may include a charge trap layer 420 disposed on the charge barrier layer 410 along the inner surface of the trench 10, and a tunneling structure 430 may be disposed on the charge trap layer 420. A channel layer 440 may be disposed to contact the tunneling structure 430. The charge barrier layer 410, the charge trap layer 420 and the tunneling structure 430 may be separated from each other by the source contact layer 203 with respect to the direction perpendicular to the substrate 210. As an example, the charge barrier layer 410, the charge trap layer 420 and the tunneling structure 430 may be disposed to cover the first and second portions 10a and 10b of the trench 10. On the other hand, the channel layer 440 may be formed to cover all of the first and second portions 10a and 10b of the trench 10 and the source contact layer 203. That is, a portion of the channel layer 440 may be disposed to contact a sidewall surface of the source contact layer 203. Accordingly, the channel layer 440 can be electrically connected to the source contact layer 203. In other words, the source contact layer 203 may partially protrude inside the trench 10 so that it may divide the charge barrier layer 410, the charge trap layer 420 and the tunneling structure 430 in the direction perpendicular to the substrate 201 while not dividing or separating the channel layer 440.

Referring to FIG. 5B, the tunneling structure 430 may include a first tunneling layer 430a having a first insulative material, a second tunneling layer 430b having a resistance switching material, and a third tunneling layer 430c having a second insulative material. The first to third tunneling layers 430a, 430b and 430c may extend in the direction perpendicular to the substrate 201, that is, the z-direction. Meanwhile, a filling insulation layer 450 may be disposed on the channel layer 440. In an embodiment, the filling insulation layer 450 may be disposed inside the trench 10 to fill the trench 10.

A channel contact layer 460 (see FIG. 5A) may be disposed on the top surface of the filling insulation layer 450. The channel contact layer 460 may be disposed directly on the top surface of the filling insulation layer 450. The channel contact layer 460 may be electrically connected to a bit line (not illustrated) so that one end of the channel layer 440 can be electrically connected to the bit line. As described above, one end of the channel layer 440 may be connected to the source contact layer 203, and the other end of the channel layer 440 may be electrically connected to a source line (not illustrated) through the source contact layer 203.

Portions of the charge barrier layer 410, the charge trap layer 420, the tunneling structure 430 and the channel layer 440, which are laterally covered by the first to eighth gate electrode layers 310a, 310b, 310c, 310d, 310e, 310f, 310g and 310h may constitute the lower selection transistor LST, the first to sixth memory cell transistors MC1, MC2, MC3, MC4, MC5 and MC6, and the upper selection transistor UST illustrated in FIG. 4, respectively.

Referring to FIGS. 5A and 5B, the substrate 201 may be a semiconductor substrate. The semiconductor substrate may, for example, be a silicon (Si) substrate, a gallium arsenic (GaAs) substrate, an indium phosphide (InP) substrate, a germanium (Ge) substrate, or a silicon germanium (SiGe) substrate. The semiconductor substrate may be doped with n-type or p-type dopants for enhanced conductivity. The source contact layer 203 may be disposed on the substrate 201. The source contact layer 203 may be disposed directly on the substrate 201. As an example, the source contact layer 203 may include a semiconductor material doped into n-type or p-type. Specifically, the source contact layer 203 may include n-type doped silicon (Si).

In some embodiments, although it is not illustrated, the substrate 201 may include a well region doped with an n-type dopant or a p-type dopant. Various types of semiconductor integrated circuits may be disposed between the substrate 201 and the source contact layer 203. As an example, one or more conductive circuit pattern layers and one or more insulation pattern layers for insulating the conductive circuit pattern layer may be disposed between the substrate 201 and the source contact layer 203.

A source insulation layer 205 may be disposed on the source contact layer 203. The source insulation layer 205 may be disposed directly on the source contact layer 203. The source insulation layer 205 may electrically insulate the source contact layer 203 and the first gate electrode layer 310a. The source insulation layer 205 may be formed of an insulative material, including for example, an insulative oxide, an insulative nitride, an insulative oxynitride, and so on.

The first to eighth gate electrode layers 310a, 310b, 310c, 310d, 310e, 310f, 310g and 310h and the first to eighth interlayer insulation layers 210a, 210b, 210c, 210d, 210e, 210f, 210g and 210h may be alternately disposed over the source contact layer 203.

The first to eighth gate electrode layers 310a, 310b, 310c, 310d, 310e, 310f, 310g and 310h may be electrically connected to the lower selection line (not illustrated), the word line (not illustrated), and the upper selection line (not illustrated) of the nonvolatile memory device described above with reference to FIG. 4. The first to eighth gate electrode layers 310a, 310b, 310c, 310d, 310e, 310f, 310g and 310h may, for example, include metal, conductive metal nitride, conductive metal silicide, conductive metal oxide, conductive metal carbide, and so on. The first to eighth gate electrode layers 310a, 310b, 310c, 310d, 310e, 310f, 310g and 310h may, for example, include tungsten (W), titanium (Ti), copper (Cu), ruthenium (Ru), tungsten nitride, titanium nitride, tantalum nitride, ruthenium oxide, tungsten carbide, titanium carbide, tungsten silicide, titanium silicide, tantalum silicide, or a combination of two or more thereof.

The first to eighth interlayer insulation layers 210a, 210b, 210c, 210d, 210e, 210f, 210g and 210h may, for example, include insulative oxide, insulative nitride, insulative oxynitride, and so on. The first to eighth interlayer insulation layers 210a, 210b, 210c, 210d, 210e, 210f, 210g and 210h may, for example, include silicon oxide, silicon nitride, and silicon oxynitride.

The charge barrier layer 410 can function as a barrier layer for suppressing the electrons or holes introduced into the charge trap layer 420 from the channel layer 440 to move to the gate electrode layers 310a, 310b, 310c, 310d, 310e, 310f, 310g and 310h. The configuration of the charge barrier layer 410 may be substantially the same as the configuration of the charge barrier layer 130 described above with reference to FIG. 1.

The charge trap layer 420 may trap the electrons introduced from the channel layer 440 in the trap sites of the charge trap layer 420 and store the electrons in a nonvolatile manner during the program operation of the memory cell transistor. In addition, the charge trap layer 420 may recombine the holes introduced from the channel layer 440 with the electrons stored in the charge trap layer 420 so that the stored electrons can be removed during the erase operation. The configuration of the charge trap layer 420 may be substantially the same as the configuration of the charge trap layer 120 described above with reference to FIG. 1.

The tunneling structure 430 may include the first to third tunneling layers 430a, 430b and 430c. The first tunneling layer 430a may be disposed to contact the channel layer 440, and the third tunneling layer 430c may be disposed to contact the charge trap layer 420. As illustrated in the embodiment of FIG. 5B, the first tunneling layer 430a may directly contact the channel layer 440, and the third tunneling layer 430c may directly contact the charge trap layer 420. The second tunneling layer 430b may be disposed between the first tunneling layer 430a and the third tunneling layer 430c. As illustrated in the embodiment of FIG. 5B, the second tunneling layer 430b may directly contact both the first and third tunneling layers 430a, 430b. The configurations and functions of the first to third tunneling layers 430a, 430b and 430c may be substantially the same as the configurations and functions of the first to third tunneling layers 112, 114 and 116 described above with reference to FIGS. 1, and 3A to 3C.

The channel layer 440 may be disposed to extend in a direction perpendicular to the substrate 201, that is, the z-direction and to cover the tunneling structure 430. The channel layer 440 may directly contact the first tunneling layer 430a of the tunneling structure 430. In addition, a portion of the channel layer 440 may be disposed to contact the source contact layer 203 to be electrically connected to the source line (not illustrated) through the source contact layer 203. As illustrated in FIG. 5A the portion of the channel layer 440 which is at the same level as the source contact layer may directly contact the source contact layer 203. The channel layer 440 may, for example, include a semiconductor material. For example, the channel layer 440 may be a single layer of a uniform thickness along its entire length and may be formed of a semiconductor material. The semiconductor material may include, for example, silicon (Si), germanium (Ge), silicon germanium (SiGe), gallium arsenic (GaAs), indium gallium arsenic (InGaAs), or a combination of two or more thereof.

In an embodiment, the semiconductor material may be doped into n-type and p-type. The channel layer 440 may, for example, include conductive metal oxide. The conductive metal oxide may include indium-gallium-zinc (InGaZn) oxide, indium-tin (InSn) oxide and so on. A remaining space in the trench 10 may be filled with the filling insulation layer 450. The filling insulation layer 450 may include an insulative material. The insulative material may, for example, include oxide, nitride, or oxynitride.

As described above, according to the embodiment of the present disclosure, the tunneling structures inside the memory cell transistors may include first to third tunneling layers. The second tunneling layer disposed between the first and third tunneling layers may include a resistance switching material. The second tunneling layer can function as a barrier to charge tunneling below a predetermined threshold voltage, thereby improving the retention characteristic of the charge stored in the charge trap layer. In addition, the second tunneling layer loses its function as a barrier layer for charge tunneling at a voltage equal to or greater than the predetermined threshold voltage, thereby increasing charge tunneling from the substrate to the charge trap layer. Therefore, the efficiency of program and erase operations of the nonvolatile memory device can be improved.

FIGS. 6 to 11 are cross-sectional views schematically illustrating a method of manufacturing a nonvolatile memory device according to an embodiment of the present disclosure. Specifically, the method of manufacturing described below with reference to FIGS. 6 to 11 can be applied to manufacturing the nonvolatile memory device 3 of FIGS. 5A and 5B.

Figure 6:
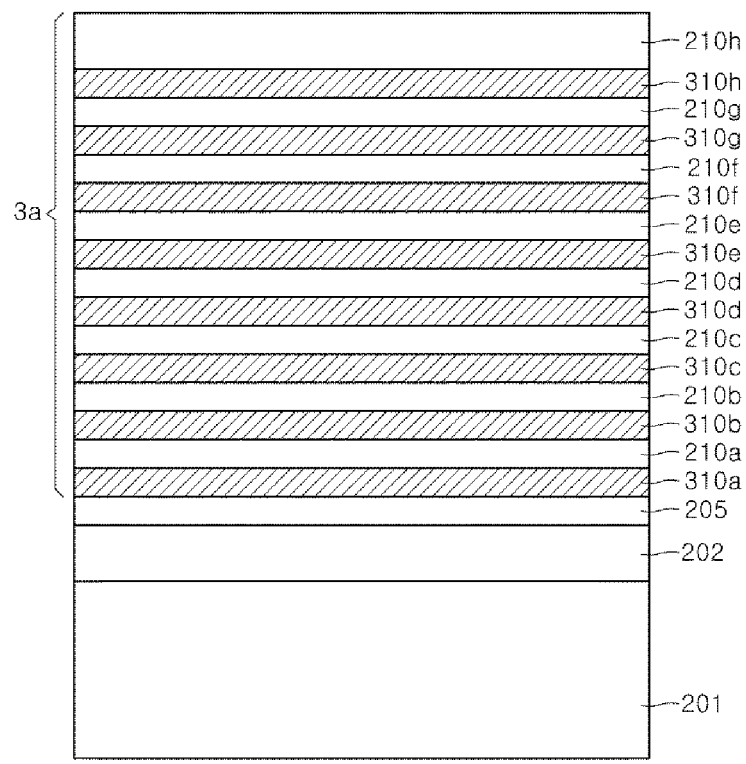
FIGS. 6 to 11 are cross-sectional views schematically illustrating a method of manufacturing a nonvolatile memory device according to an embodiment of the present disclosure.

Referring to FIG. 6, a substrate 201 may be provided. The substrate 201 may be a semiconductor substrate. The semiconductor substrate may, for example, be a silicon (Si) substrate, a gallium arsenic (GaAs) substrate, an indium phosphide (InP) substrate, a germanium (Ge) substrate, or a silicon germanium (SiGe) substrate. The semiconductor substrate may be doped with n-type or p-type dopants for enhanced conductivity.

Next, a sacrificial layer 202 and a source insulation layer 205 may be formed on the substrate 201. The sacrificial layer 202 may directly contact the substrate 201. The sacrificial layer 202 may be formed of material having an etch selectivity with respect to the substrate 201 and the source insulation layer 205. The sacrificial layer 202 may, for example, be made of oxide, nitride or oxynitride. The sacrificial layer 202 may be removed at a process associated with FIG. 10, described below, and a source contact layer 203 may be formed in the removed space in the sacrificial layer 202. The source insulation layer 205 may, for example, be formed of oxide, nitride or oxynitride. The sacrificial layer 202 and the source insulation layer 205 may be formed, for example, by a chemical vapor deposition method or an atomic layer deposition method.

Then, an electrode stack structure 3a may be formed on the source insulation layer 205. The electrode stack structure 3a may be formed directly on the source insulation layer 205. The electrode stack structure 3a may include gate electrode layers 310a, 310b, 310c, 310d, 310e, 310f, 310g and 310h and interlayer insulation layers 210a, 210b, 210c, 210d, 210e, 210f, 210g and 210h, which are alternately stacked in the z direction. As illustrated, a lowest gate electrode layer 310a may directly contact the source insulation layer 205. An uppermost interlayer insulation layer 210h may have a greater thickness than the rest interlayer insulation layers 210b, 210c, 210d, 210e, 210f and 210g. The gate electrode layers 310a, 310b, 310c, 310d, 310e, 310f, 310g and 310h and the interlayer insulation layers 210a, 210b, 210c, 210d, 210e, 210f, 210g and 210h may be formed, for example, in a sequential manner, by a chemical vapor deposition method or an atomic layer deposition method.

Figure 7:
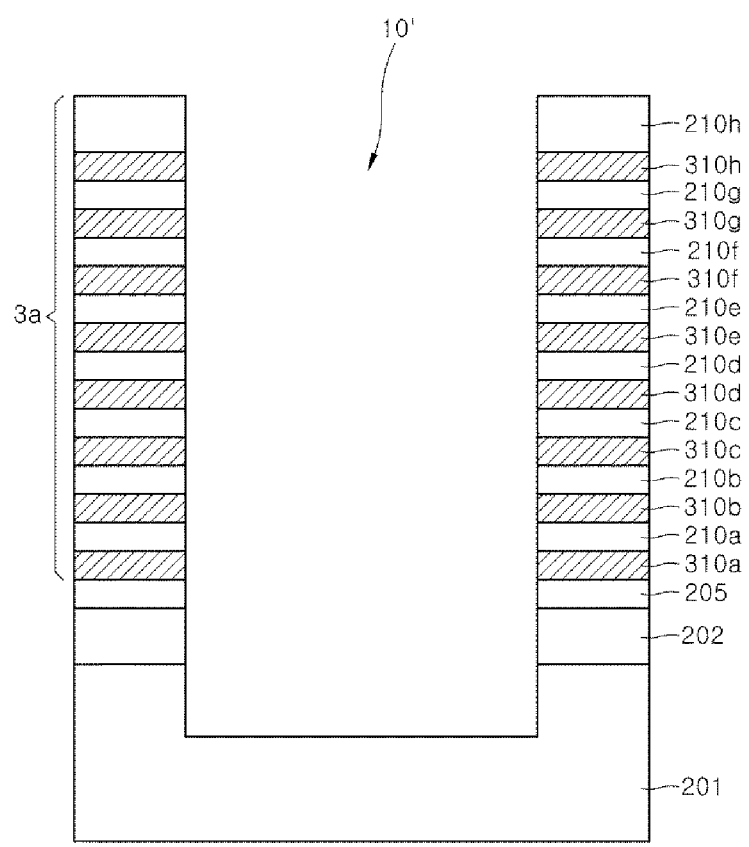

Referring to FIG. 7, a trench 10' may be formed to penetrate the electrode stack structure 3a, the source insulation layer 205, the sacrificial layer 202 and an upper portion of the substrate 201. Specifically, the electrode stack structure 3a, the source insulation layer 205 and the sacrificial layer 202 on the substrate 201 may be selectively etched to form the trench 10' exposing the substrate 201. During the selective etching, the exposed upper portion of the substrate 201 may be removed. As a result of etching, side surfaces of the electrode stack structure 3a, the source insulation layer 205 and the sacrificial layer 202 may be exposed from the sidewall surface of the trench 10'. As an example of a method of forming the trench 10', an anisotropic etching method may be applied.

Figure 8:
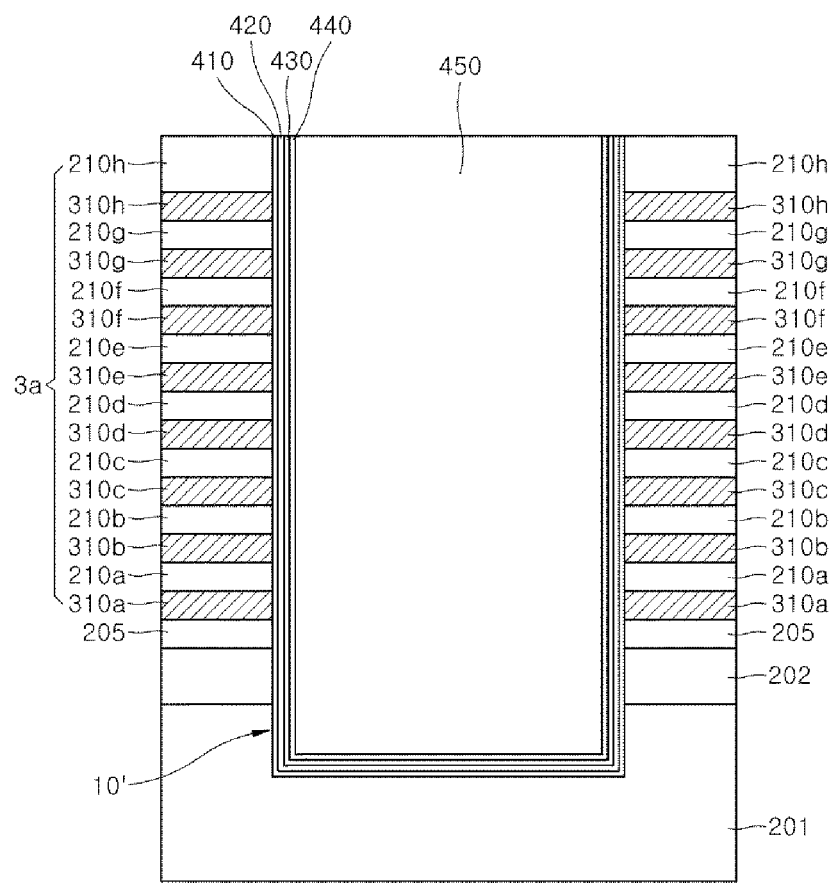

Referring to FIG. 8, a charge barrier layer 410, a charge trap layer 420, a tunneling structure 430 and a channel layer 440 may be sequentially formed on an inner surface of the trench 10'. The tunneling structure 430 may include a first tunneling layer 430a, a second tunneling layer 430b, and a third tunneling layer 430c sequentially formed from the channel layer, as shown in FIG. 5A. The charge barrier layer 410, the charge trap layer 420, the first to third tunneling layers 430a, 430b and 430c and the channel layer 440 may be formed, for example, by a chemical vapor deposition method or an atomic layer deposition method.

Then, the trench 10' in which the charge barrier layer 410, the charge trap layer 420, the tunneling structure 430 and the channel layer 440 are formed may be filled with an insulative material to form a filling insulation layer 450. The insulative material may, for example, include oxide, nitride or oxynitride.

Next, a planarization process may be performed with respect to the charge barrier layer 410, the charge trap layer 420, the tunneling structure 430, the channel layer 440 and the filling insulation layer 450 formed outside the trench 10'. As a result, as illustrated in FIG. 8, the upper surfaces of the charge barrier layer 410, the charge trap layer 420, the tunneling structure 430, the channel layer 440 and the filling insulation layer 450 may be located on the same plane as the upper surface of the uppermost interlayer insulation layer 210h. The planarization process may be performed by applying, for example, a chemical mechanical polishing method.

Figure 9:
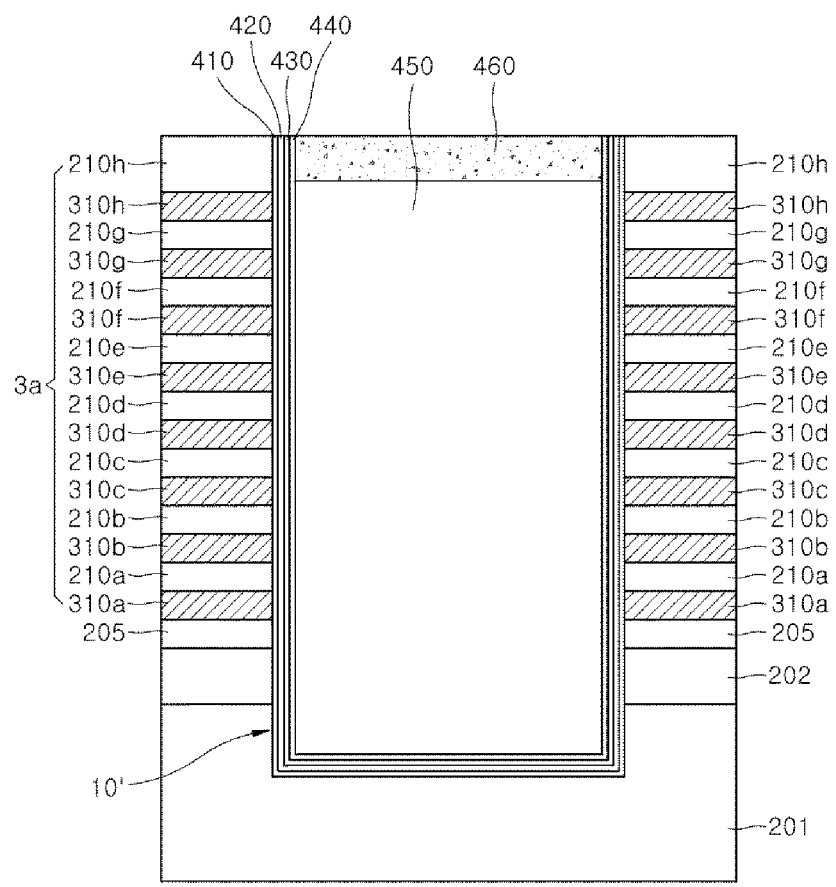

Referring to FIG. 9, an upper portion of the filling insulation layer 450 may be selectively etched to form a recess. The recess may be filled with a conductive material to form a channel contact layer 460. The conductive material may, for example, be a semiconductor material doped with n-type or p-type dopants. As a specific example, the conductive material may be an n-type doped silicon. The channel contact layer 460 may be formed to directly contact the channel layer 440 in the lateral direction.

Figure 10:
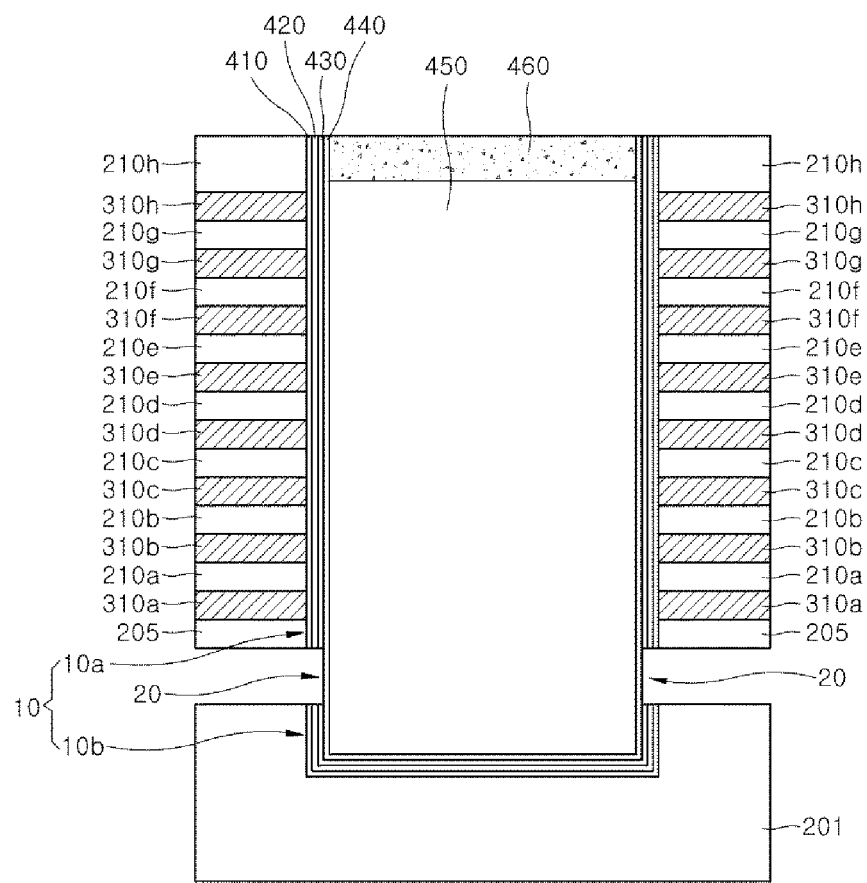

Referring to FIG. 10, a separate trench (not illustrated) may be formed spaced from the trench 10' of FIG. 9. The trench may penetrate the electrode stack structure 3a and the source insulation layer 205, and to expose the sacrificial layer 202. Then, an etchant may be provided into the trench to etch and remove the sacrificial layer 202. Also, after removing the sacrificial layer 202, the charge barrier layer 410, the charge trap layer 420 and the tunneling structure 430 that are exposed in the lateral direction may be sequentially etched to form a laterally recessed space 20 exposing the channel layer 440. As the laterally recessed space 20 is formed, the trench 10' can be converted into a trench 10 including a first portion 10a and a second portion 10b that are separated from each other.

Figure 11:
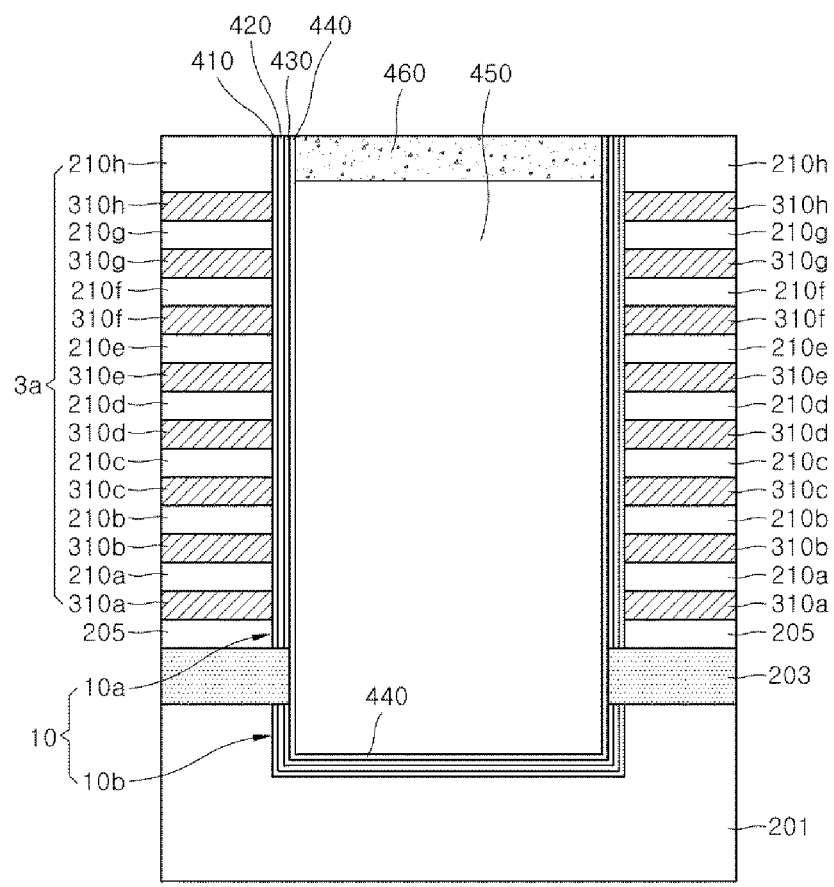

Referring to FIG. 11, the laterally recessed space 20 may be filled with a conductive material to form a source contact layer 203. The conductive material may be, for example, a semiconductor material doped with n-type or p-type dopants. As a specific example, the conductive material may be an n-type doped silicon. The source contact layer 203 may be formed to directly contact a portion of the channel layer 440.

Figure 12:
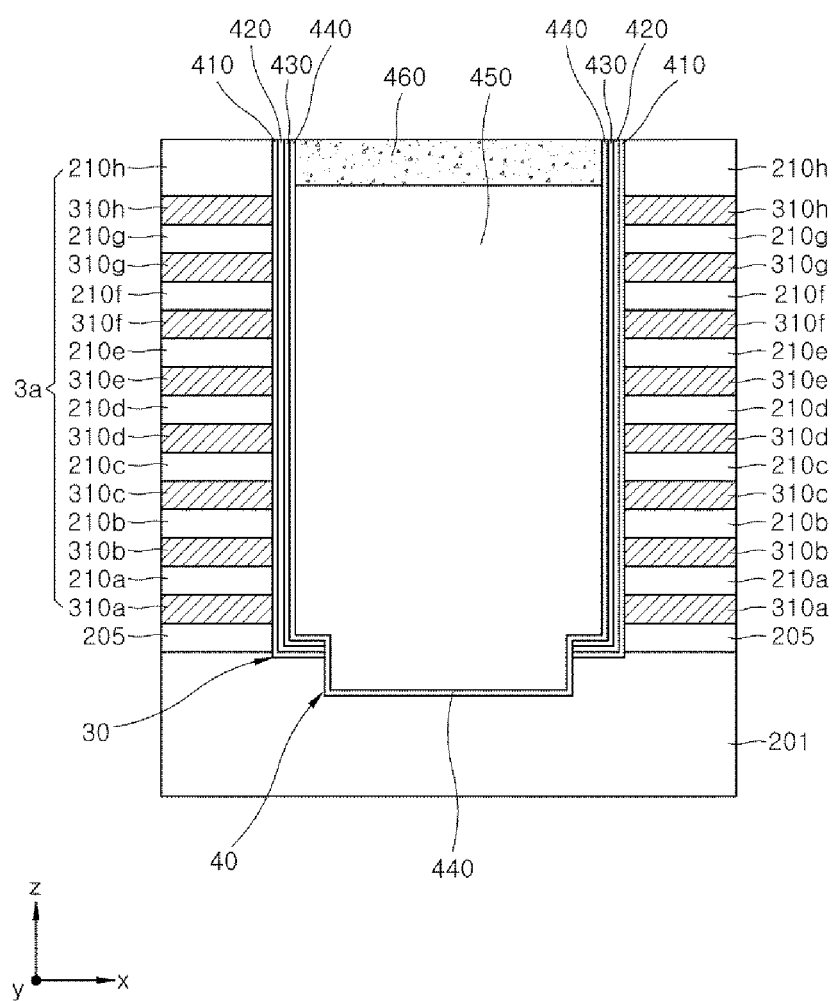
FIG. 12 is a cross-sectional view schematically illustrating a nonvolatile memory device according to another embodiment of the present disclosure.

FIG. 12 is a cross-sectional view schematically illustrating a nonvolatile memory device 4 according to another embodiment of the present disclosure. The nonvolatile memory device 4 of FIG. 12 may be an implementation of the nonvolatile memory device 2 having the circuit diagram of FIG. 4.

The nonvolatile memory device 4 can be distinguished in that it has a first trench 30 and a second trench 40 formed in the first trench 30, as compared to the nonvolatile memory device 3 described above with reference to FIGS. 5A and 5B.

Referring to FIG. 12, a charge barrier layer 410, a charge trap layer 420, a tunneling structure 430 and a channel layer 440 may be sequentially disposed along an inner surface of the first trench 30. Only the channel layer 440 may also be disposed along an inner surface of the second trench 40. In addition, the nonvolatile memory device 4 does not have the source contact layer 203 as compared to the nonvolatile memory device 3. Accordingly, a substrate 201 doped with n-type or p-type dopants for enhanced conductivity may be connected to a source line (not illustrated). Referring to FIG. 12, the channel layer 440 in the second trench 40 may be disposed to be directly connected to the substrate 201. One end of the channel layer 440 may be electrically connected to the source line through the substrate 201. In addition, the other end of the channel layer 440 may be electrically connected to a bit line (not illustrated) through the channel contact layer 460, as described above.

As described above, the nonvolatile memory device 4 may include tunneling structures including first to third tunneling layers inside memory cell transistors. The second tunneling layer disposed between the first and third tunneling layers may include a resistance switching material. The second tunneling layer may function as a barrier to charge tunneling below a predetermined threshold voltage, thereby improving the retention characteristic of the charge stored in the charge trap layer. In addition, the second tunneling layer may not function as a barrier for charge tunneling at a voltage equal to or greater than a predetermined threshold voltage, thereby increasing charge tunneling from the substrate to the charge trap layer. Accordingly, the program and erase efficiency of the nonvolatile memory device can be improved.

FIGS. 13 to 16 are cross-sectional views schematically illustrating a method of manufacturing a nonvolatile memory device according to another embodiment of the present disclosure. Specifically, the method of manufacturing described below with reference to FIGS. 13 to 16 may be applied to the manufacturing of the nonvolatile memory device 4 described above with reference to FIG. 12.

Figure 13:
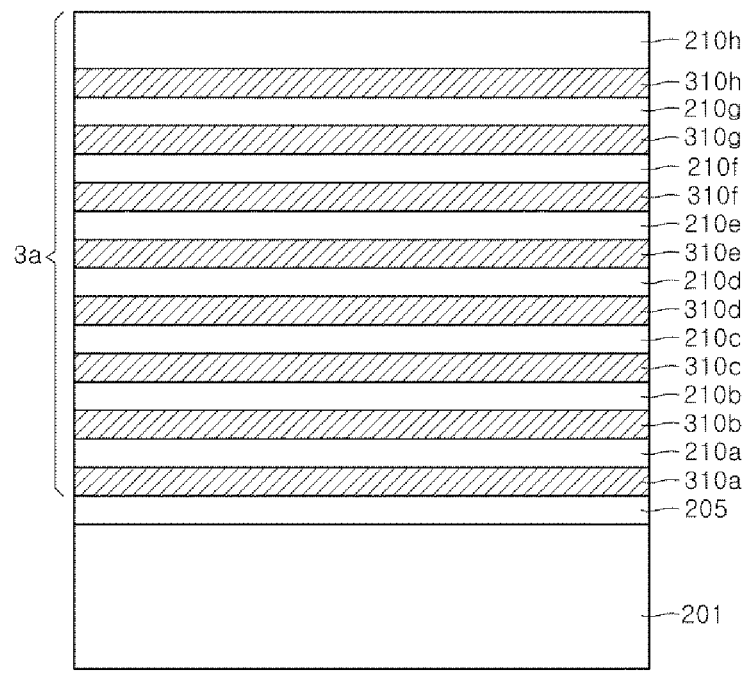
FIGS. 13 to 16 are cross-sectional views schematically illustrating a method of manufacturing a nonvolatile memory device according to another embodiment of the present disclosure.

Referring to FIG. 13, a substrate 201 may be provided. The substrate 201 may be a semiconductor substrate doped with n-type or p-type dopants for enhanced conductivity. A source insulation layer 205 may be formed on the substrate 201. The source insulation layer 205 may be formed directly on the substrate 201. The source insulation layer 205 may be formed, for example, by a chemical vapor deposition method or an atomic layer deposition method.

Next, an electrode stack structure 3a may be formed on the source insulation layer 205. The electrode stack structure 3a may include gate electrode layers 310a, 310b, 310c, 310d, 310e, 310f, 310g and 310h and interlayer insulation layers 210a, 210b, 210c, 210d, 210e, 210f, 210g and 210h that are alternately stacked in the z direction. As illustrated, a lowermost gate electrode layer 310a may directly contact the source insulation layer 205. An uppermost interlayer insulation layer 210h may have a greater thickness than the remaining interlayer insulation layers 210a, 210b, 210c, 210d, 210e, 210f and 210g. The gate electrode layers 310a, 310b, 310c, 310d, 310e, 310f, 310g and 310h and the interlayer insulation layers 210a, 210b, 210c, 210d, 210e, 210f, 210g and 210h may be formed, for example, by a chemical vapor deposition method or an atomic layer deposition method.

Figure 14:
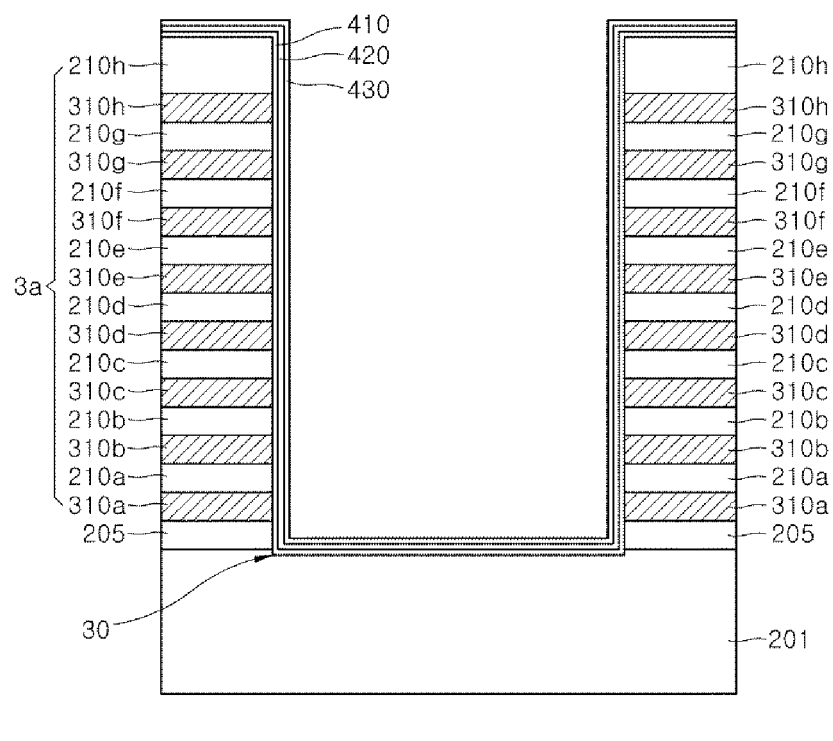

Referring to FIG. 14, a first trench 30 may be formed to penetrate the electrode stack structure 3a and the source insulation layer 205 to expose the substrate 201. As a result of etching, side surfaces of the electrode stack structure 3a and the source insulation layer 205 may be exposed from a sidewall surface of the first trench 30. The first trench 30 may be formed, for example, by applying an anisotropic etching method.

A charge barrier layer 410, a charge trap layer 420, and a tunneling structure 430 may be sequentially formed on the inner surface of the first trench 30. The tunneling structure 430 may include a third tunneling layer 430c, a second tunneling layer 430b and a first tunneling layer 430a sequentially formed from the charge trap layer 420, as illustrated in FIG. 5A. The charge barrier layer 410, the charge trap layer 420 and the first to third tunneling layers 430a, 430b and 430c may be formed, for example, by a chemical vapor deposition method or an atomic layer deposition method.

Figure 15:
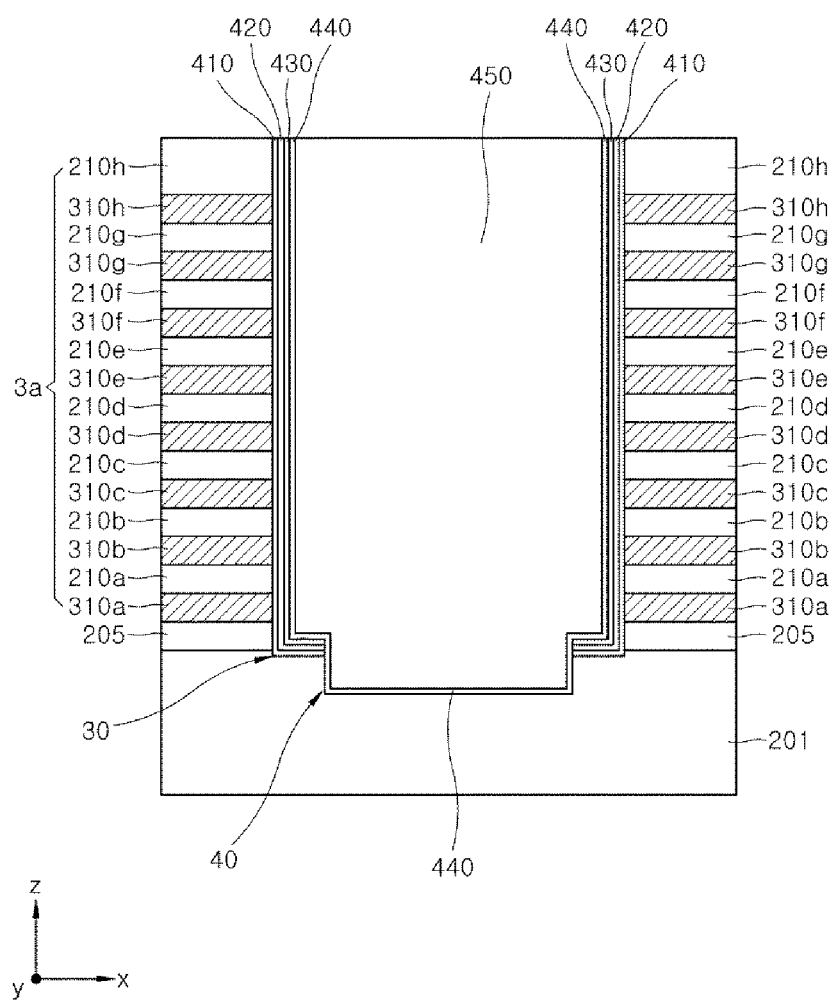

Referring to FIG. 15, a second trench 40 may be formed under the first trench 30. In a specific embodiment, the tunneling structure 430, the charge trap layer 420 and the charge barrier layer 410 formed on a bottom surface of the first trench 30 may be selectively etched, and then, the substrate 201 may be anisotropically etched to a predetermined depth to form the second trench 40.

Next, a channel layer 440 may be formed along inner surfaces of the first trench 30 and the second trench 40. Accordingly, the channel layer 440 may be formed on the tunneling structure 430 of the first trench 30 and on the substrate 201 of the second trench 40. In addition, the channel layer 440 may be formed on portions of the charge barrier layer 410, the charge trap layer 420 and the tunneling structure 430 at a boundary portion of the first trench 30 and the second trench 40. The channel layer 440 may be formed, for example, by a chemical vapor deposition method or an atomic layer deposition method.

Next, the first and second trenches 30 and 40 in which the charge barrier layer 410, the charge trap layer 420, the tunneling structure 430 and the channel layer 440 are formed may be filled with an insulative material to form a filling insulation layer 450. The insulative material may, for example, include oxide, nitride or oxynitride.

Then, a planarization process may be performed with respect to the charge barrier layer 410, the charge trap layer 420, the tunneling structure 430, the channel layer 440 and the filling insulation layer 450 formed outside the first trench 30. As a result, as illustrated in FIG. 15, upper surfaces of the charge barrier layer 410, the charge trap layer 420, the tunneling structure 430, the channel layer 440 and the filling insulation layer 450 can be located on the same plane as an upper surface of the uppermost interlayer insulation layer 210h. The planarization process may be performed, for example, by applying a chemical mechanical polishing method.

Figure 16:
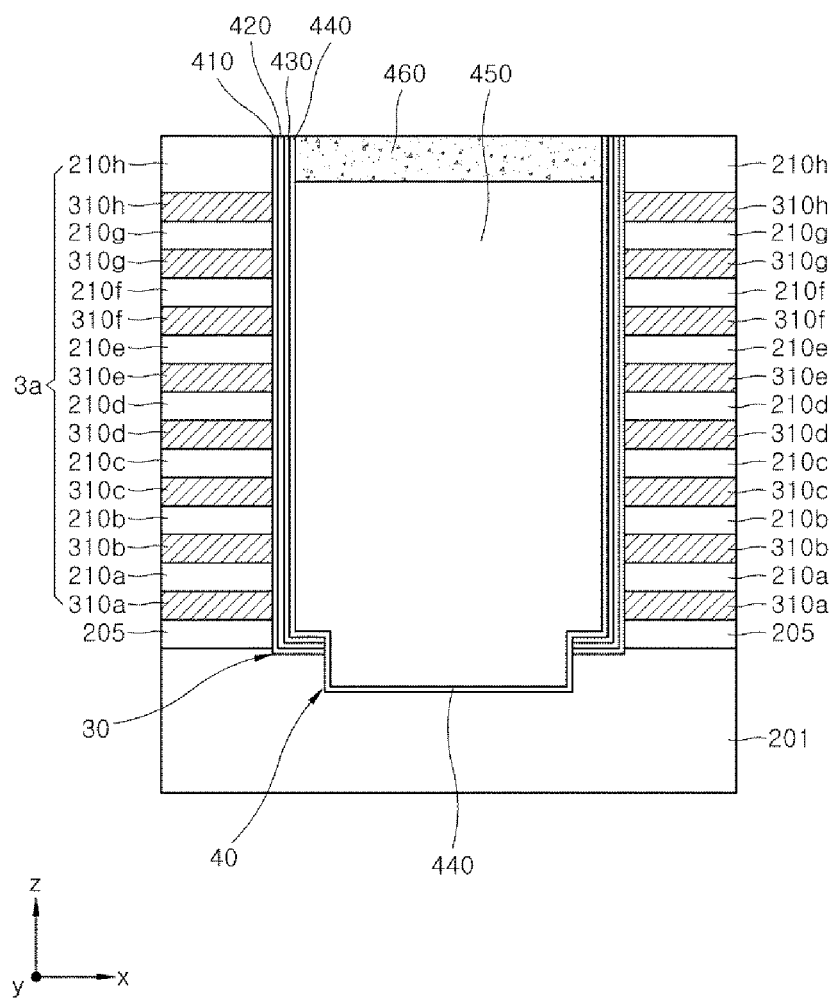

Referring to FIG. 16, an upper portion of the filling insulation layer 450 may be selectively etched to form a recess. Then, the recess may be filled with a conductive material to form a channel contact layer 460. The conductive material may, for example, be a semiconductor material doped with n-type or p-type dopants. As a specific example, the conductive material may be an n-type doped silicon. The channel contact layer 460 may be formed to directly contact the channel layer 440 in the lateral direction. Through the above-described processes, the nonvolatile memory device according to an embodiment of the present disclosure can be manufactured.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A nonvolatile memory device comprising:
a substrate;
an electrode stack structure disposed on the substrate, the electrode stack structure including gate electrode layers and interlayer insulation layers, which are alternately stacked in a direction perpendicular to the substrate;
a first trench penetrating the electrode stack structure on the substrate to expose sidewall surfaces of the gate electrode layers and the interlayer insulation layers;
a charge barrier layer disposed to cover the interlayer insulation layers and the gate electrode layers along an inner surface of the trench;
a charge trap layer disposed on the charge barrier layer along the inner surface of the trench;
a tunneling structure disposed on the charge trap layer along the inner surface of the trench; and
a channel layer disposed to contact the tunneling structure,
wherein the tunneling structure comprises:
a first tunneling layer including a first insulative material;
a second tunneling layer including a resistance switching material; and
a third tunneling layer including a second insulative material,
wherein when a voltage equal to or greater than a predetermined threshold voltage is applied to the second tunneling layer, a resistance state of the second tunneling layer is configured to be converted from a high resistance state to a low resistance state, and
wherein when the voltage applied to the second tunneling layer is removed from the second tunneling layer, the resistance state of the second tunnel layer is configured to be converted from the low resistance state to the high resistance state.

2. The nonvolatile memory device of claim 1, wherein each of the first to third tunneling layers extends in a direction perpendicular to the substrate.

3. The nonvolatile memory device of claim 1, wherein the resistance switching material is a material whose electric resistance varies reversibly between a high resistance state and a low resistance state depending on a magnitude of an applied electric field.

4. The nonvolatile memory device of claim 1, wherein, when a voltage equal to or greater than a predetermined threshold voltage is applied to the second tunneling layer, the second tunneling layer has an output current that is nonlinearly increased in response to the voltage.

5. The nonvolatile memory device of claim 1, wherein the resistance switching material comprises at least one selected from the group consisting of an indium-antimony-tellurium-based alloy, a germanium-antimony-tellurium-based alloy, an arsenic-antimony-tellurium-based alloy, and a tin-antimony-tellurium-based alloy.

6. The nonvolatile memory device of claim 1, wherein the resistance switching material comprises at least one selected from the group consisting of niobium oxide, vanadium oxide, copper-doped silicon oxide, and silver-doped titanium oxide.

7. The nonvolatile memory device of claim 1, wherein each of the first insulative material and the second insulative material comprises at least one selected from the group consisting of silicon oxide, silicon nitride, and silicon oxynitride.

8. The nonvolatile memory device of claim 1, wherein the charge barrier layer comprises at least one selected from the group consisting of silicon oxide, silicon nitride, and silicon oxynitride.

9. The nonvolatile memory device of claim 1, wherein the channel layer comprises at least one selected from the group consisting of silicon, germanium, silicon germanium, gallium arsenic, indium gallium arsenic, indium-gallium-zinc oxide, and indium-tin oxide.

10. The nonvolatile memory device of claim 1, further comprising:
a channel contact layer and a source contact layer contacting different ends of the channel layer, and
wherein the channel contact layer and the source contact layer are electrically connected to a bit line and a source line, respectively.

11. The nonvolatile memory device of claim 1, further comprising:
a source contact layer disposed between the substrate and the stack structure and contacting the channel layer.

12. A nonvolatile memory device comprising:
a substrate;
an electrode stack structure disposed on the substrate, the electrode stack structure including gate electrode layers;
a charge barrier layer disposed to cover sidewall surfaces of the electrode stack;
a charge trap layer disposed on the charge barrier layer;
a tunneling structure disposed on the charge trap layer; and
a channel layer disposed to contact the tunneling structure, wherein the tunneling structure comprises:
a first tunneling layer including a first insulative material;
a second tunneling layer including a resistance switching material; and
a third tunneling layer including a second insulative material,
wherein when a voltage equal to or greater than a predetermined threshold voltage is applied to the second tunneling layer, a resistance state of the second tunneling layer is configured to be converted from a high resistance state to a low resistance state, and
wherein when the voltage applied to the second tunneling layer is removed from the second tunneling layer, the resistance state of the second tunnel layer is configured to be converted from the low resistance state to the high resistance state.

13. The nonvolatile memory device of claim 12,
wherein each of the first to third tunneling layers extends in a direction perpendicular to the substrate.

14. The nonvolatile memory device of claim 12,
wherein the resistance switching material comprises at least one selected from the group consisting of an indium-antimony-tellurium-based alloy, a germanium-antimony-tellurium-based alloy, an arsenic-antimony-tellurium-based alloy, and a tin-antimony-tellurium-based alloy.

15. The nonvolatile memory device of claim 12,
wherein the resistance switching material comprises at least one selected from the group consisting of niobium oxide, vanadium oxide, copper-doped silicon oxide, and silver-doped titanium oxide.

16. The nonvolatile memory device of claim 12,
wherein the charge barrier layer comprises at least one selected from the group consisting of silicon oxide, silicon nitride, and silicon oxynitride.

17. The nonvolatile memory device of claim 12,
wherein the channel layer comprises at least one selected from the group consisting of silicon, germanium, silicon germanium, gallium arsenic, indium gallium arsenic, indium-gallium-zinc oxide, and indium-tin oxide.

18. The nonvolatile memory device of claim 12, further comprising:
a channel contact layer and a source contact layer contacting different ends of the channel layer, and
wherein the channel contact layer and the source contact layer are electrically connected to a bit line and a source line, respectively.

19. The nonvolatile memory device of claim 12, further comprising:
a source contact layer disposed between the substrate and the stack structure and contacting the channel layer.

* * * * *